United States Patent
Leidy et al.

(10) Patent No.: US 6,513,796 B2
(45) Date of Patent: Feb. 4, 2003

(54) WAFER CHUCK HAVING A REMOVABLE INSERT

(75) Inventors: Robert K. Leidy, Burlington, VT (US); Paul D. Sonntag, Colchester, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/681,210

(22) Filed: Feb. 23, 2001

(65) Prior Publication Data

US 2002/0117792 A1 Aug. 29, 2002

(51) Int. Cl.⁷ ............................................... B25B 11/00
(52) U.S. Cl. ..................... 267/21; 269/266; 269/20; 269/903; 451/388
(58) Field of Search .................. 451/388; 125/35; 269/21, 903; 279/3; 165/80.1; 118/728

(56) References Cited

U.S. PATENT DOCUMENTS

| | | |
|---|---|---|
| 3,937,579 A | 2/1976 | Schmidt |
| 4,213,698 A | 7/1980 | Firtion et al. |
| RE31,053 E * | 10/1982 | Firtion ........................ 355/77 |
| 4,506,184 A | 3/1985 | Siddall |
| 4,724,222 A | 2/1988 | Feldman |
| 4,845,530 A | 7/1989 | Matsukawa |
| 5,197,089 A | 3/1993 | Baker |
| 5,291,239 A | 3/1994 | Jackson |
| 5,382,311 A * | 1/1995 | Ishikawa ..................... 156/345 |
| 5,431,737 A * | 7/1995 | Keller .......................... 118/729 |
| 5,737,063 A | 4/1998 | Miyachi |
| 5,998,801 A | 12/1999 | Imai |
| 6,043,892 A | 3/2000 | Park |
| 6,073,681 A * | 6/2000 | Getchel ..................... 165/80.1 |
| 6,168,668 B1 * | 1/2001 | Yodovsky ................... 118/715 |
| 6,182,956 B1 * | 2/2001 | McMillan .................... 269/21 |

* cited by examiner

*Primary Examiner*—Joseph J. Hail, III
*Assistant Examiner*—Daniel Shanley
(74) *Attorney, Agent, or Firm*—Downs Rachlin Martin PLLC

(57) ABSTRACT

A vacuum chuck/insert assembly (100) for firmly supporting a semiconductor wafer (106) during wafer processing. The vacuum chuck comprises a chuck (102) and a removable insert (104). The chuck includes a base (108) and a plurality of spacers (112) for holding the insert in spaced relationship to the base of the chuck. The chuck further includes first and second vacuum seals (116, 118) and vacuum ports (128) extending through the base of the chuck. The insert includes a base (132) and a plurality of spacers (136) for holding the wafer in spaced relationship to the base of the insert. The insert further includes a vacuum seal (140) and vacuum ports (146) extending through the base of the insert. During operation, vacuum applied to the vacuum chuck/insert assembly holds the insert firmly in contact with the chuck and the wafer firmly in contact with the insert.

14 Claims, 3 Drawing Sheets

WAFER CHUCK HAVING A REMOVABLE INSERT

BACKGROUND OF THE INVENTION

Field of Invention

The present invention generally relates to the field of semiconductor wafer processing. More particularly, the present invention is directed to a wafer chuck having a removable insert.

During various steps of processing a semiconductor wafer during the manufacturing of microelectronic devices, the wafer must be held firmly in a fixed position with its processed surface as planar as possible. For example, during projection photolithography processing, the processed surface must be substantially coincident with the focal plane of the projection optics. If one or more regions of the processed surface deviate from the focal plane, the deviation must not exceed the depth of focus of the projection optics. Otherwise, the projected pattern at such regions will be distorted and the regions may be unusable.

As feature sizes of patterns are becoming increasingly smaller, so are depths of focus. This is so because smaller feature sizes require larger numerical apertures that translate into shallower depths of focus. In addition, the size of the field printed or scanned during each exposure is relatively large to increase throughput and increase productivity. These characteristics of current photolithographic practices accentuate the need for maintaining the processed surface of a wafer as planar as possible during photolithography.

Dirt particles on the backsides of wafers often present a significant obstacle in achieving the necessary planarity required for photolithographic patterning. Even with ultra-clean rooms and extensive wafer cleaning procedures, it is virtually impossible to completely rid the wafers, particularly their backsides, of dirt particles. In fact, many dirt particles that interfere with planarizing the processed surfaces of the wafer come from the wafers themselves after they have been cleaned. For example, such dirt particles are often in the form of chips from the wafer edges and flakes from films grown or deposited upon the wafers.

To minimize the impact of dirt particles on planarizing the processed surface, the wafer chucks used to hold wafers during photolithography have evolved from chucks having optically-flat surfaces for engaging the backside of a wafer to vacuum chucks having annular grooves in their optically-flat surfaces to hold the wafer firmly in place and, most recently, to pin-type, or "bed-of-nails," vacuum chucks, which are generally represented by prior art vacuum chuck 1 0 illustrated in FIGS. 1 and 2.

As shown in FIGS. 1 and 2, prior art vacuum chuck 10 comprises a metal base 12 having an upper surface 14 and a plurality of aluminum pins 16 extending upward from the upper surface. The upper ends 18 of the plurality of pins 16 all lie within a common plane that is positioned parallel to the focal plane of the projection optics. The upper end 18 of each pin 16 has a planar surface 20 that engages a wafer 22. If wafer 20 is warped or otherwise not planar, it may not engage one or more of pins 16. To reduce or eliminate any out-of-planeness of wafer 22 and/or to hold the wafer firmly to chuck 10, the chuck is connected to a vacuum source (not shown) that provides a vacuum in a vacuum region 24 located between wafer 22 and upper surface 14 of chuck vacuum 10. Vacuum region 24 is in fluid communication with the vacuum source via vacuum ports 26 and is generally isolated from the environment surrounding vacuum chuck 10 when wafer 20 is inserted therein by a seal ring 28.

Although pin-type vacuum chucks, such as vacuum chuck 10 described above, are a vast improvement over chucks having larger areas of contact with wafers, they are still subject to the influence of dirt particles and, therefore, must be cleaned periodically to prevent the dirt particles from affecting the lithography process. Over time, continual cleaning of vacuum chuck 10 typically causes upper ends 18 of pins 16 to be worn away, particularly at the pins proximate to the center of the chuck. Uneven wear among pins 16 causes the upper ends 18 of the pins to define a non-planar, rather than planar, surface, which reduces the accuracy of vacuum chuck 10, and eventually causes intolerable focus error that requires the chuck to be replaced. Another disadvantage of vacuum chuck 10 is that the wafer contact area of planar surface 20 of each pin 16 is relatively large, increasing the probability that dirt particles on wafer 22 will interfere with direct contact between the wafer and one or more pins.

BRIEF SUMMARY OF THE INVENTION

In one aspect, the present invention is directed to a chuck/insert assembly for holding a workpiece. The chuck/insert assembly comprises a chuck that includes a first base having a first surface. At least one first spacer extends away from the first surface. An insert is removably engaged with the at least one first spacer so as to form a first vacuum region between the insert and the chuck. The insert includes a second base having a second surface. At least one second spacer extends away from the second surface and has a distal end located opposite the second surface. The distal end is adapted for engaging the workpiece.

In another aspect, the present invention is directed to a method of forming an insert for a vacuum chuck from a body having a surface. The method comprises the steps of patterning onto the surface of the body at least one spacer location and removing material surrounding the at least one spacer location so as to form at least one spacer.

BRIEF DESCRIPTION OF THE SEVERAL VIEWS OF THE DRAWINGS

For the purpose of illustrating the invention, the drawings show a form of the invention that is presently preferred. However, it should be understood that the present invention is not limited to the precise arrangements and instrumentalities shown in the drawings.

DETAILED DESCRIPTION OF THE INVENTION

Figure 3:
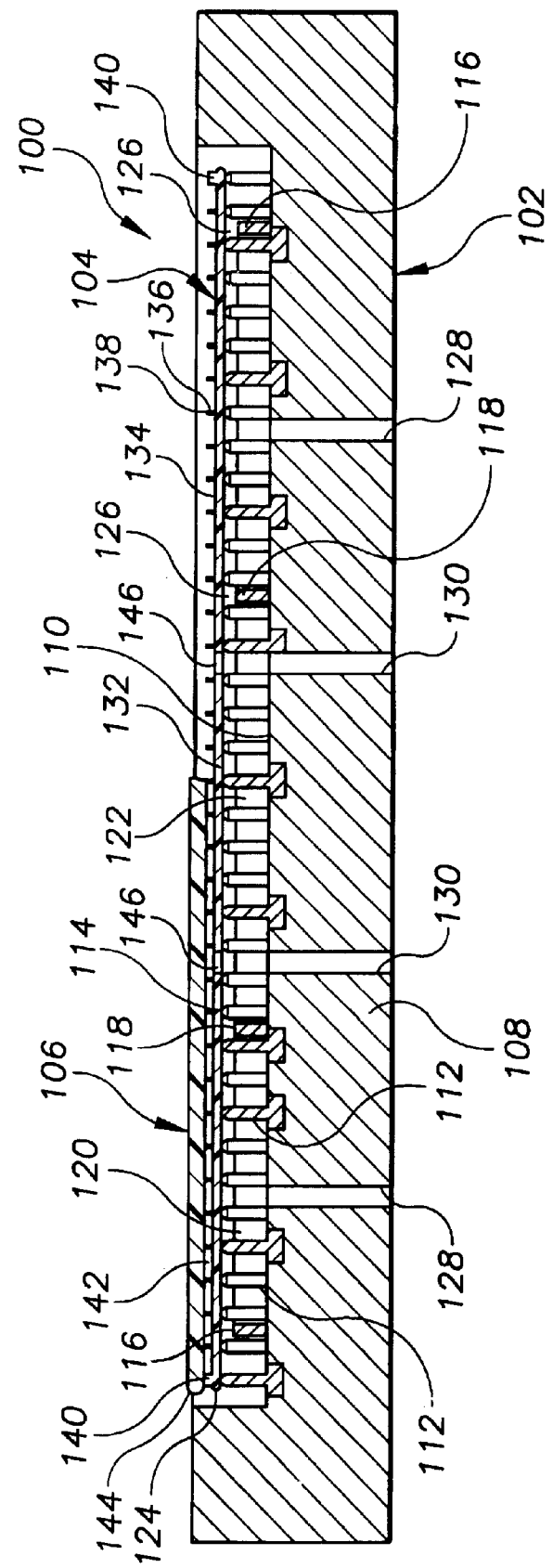
FIG. 3 is a cross-sectional view of a vacuum chuck/insert assembly according to the present invention, wherein the assembly is shown supporting a wafer partially cut away for clarity.

Referring now to the drawings, wherein like numerals indicate like elements, FIG. 3 shows in accordance with the present invention a vacuum chuck/insert assembly, which is indicated generally by the numeral 100. Vacuum chuck/insert assembly 100 includes a chuck 102 and a removable insert 104 that are adapted for holding a workpiece, such as an 8- or 12-inch diameter semiconductor wafer 106, firmly to the chuck. Removable insert 104 is the primary component of vacuum chuck/insert assembly 100 exposed to dirt particles and other foreign material that may be present on wafer 106 and other wafers (not shown) that the vacuum chuck/insert assembly may hold during its usable life. Accordingly, insert 104 may be easily removed from chuck 102, cleaned and reinserted into the chuck for further use. In addition, while insert 104 is being cleaned, a replacement insert similar to insert 104 may be used with chuck 102 so that there is virtually no operational downtime caused by cleaning the insert. Moreover, insert 104 receives most of the wear from continual cleaning and direct contact with wafer 106 and other similar wafers and, thus, may be readily replaced periodically with a new insert.

The vacuum chuck/insert assembly 100 of the present invention is described below in connection with semiconductor wafer projection photolithography. However, one skilled in the art will appreciate that vacuum chuck/insert assembly 100 may be used to support wafers for other wafer processing, such as chemical mechanical polishing. In addition, vacuum chuck/insert assembly 100 may be used for applications other than wafer processing, such as machining workpieces, e.g., with mechanical, laser and/or pressurized-fluid machining tools, and supporting slides for microscopy, among others. Moreover, vacuum chuck/insert assembly may be adapted for use with workpieces that are not planar. That is, the workpieces may be any shape desired, provided chuck 102 and insert 104 are suitably shaped. One skilled in the art will understand the variety of applications for vacuum chuck/insert assembly 100 of the present invention and how the vacuum chuck/insert assembly may be adapted for those applications.

Figure 1:
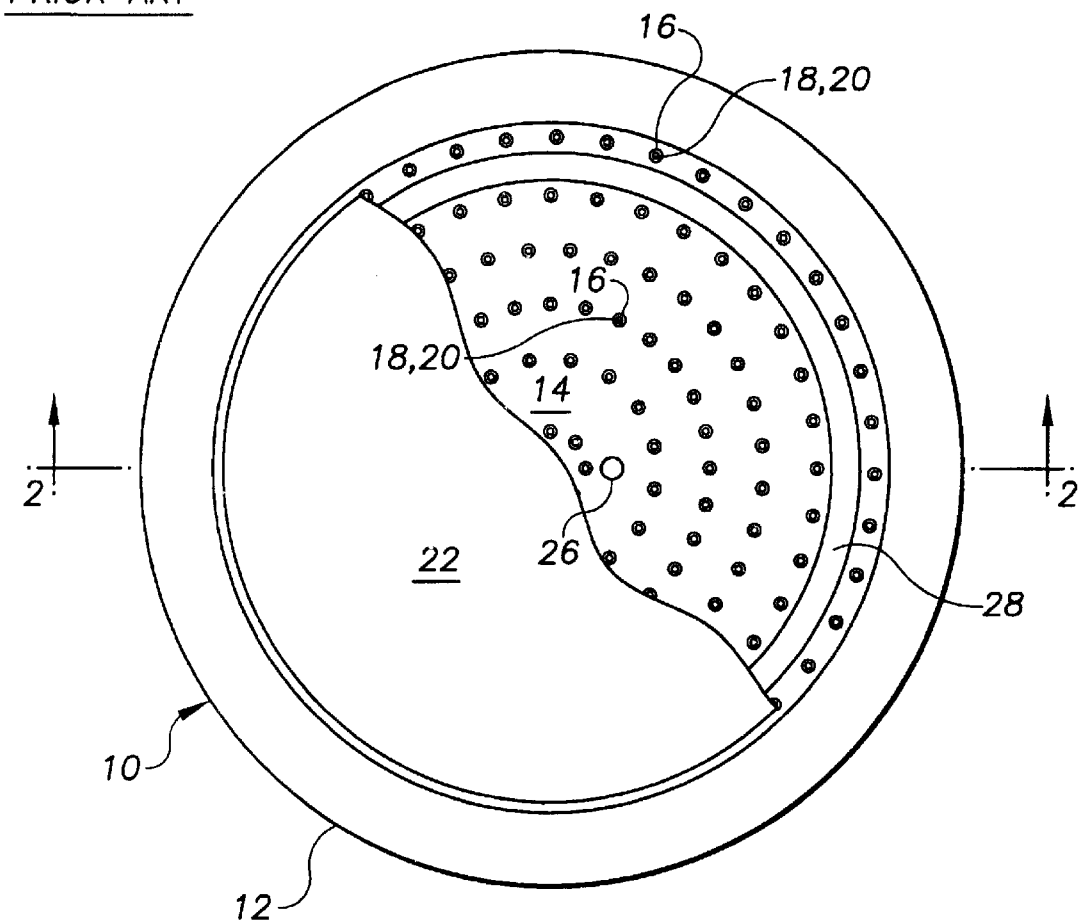
FIG. 1 is plan view of a prior art pin-type vacuum chuck.
Figure 2:
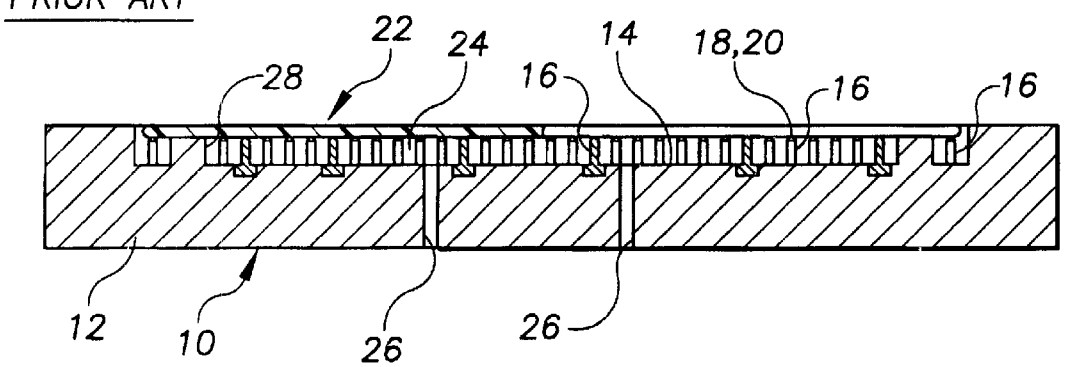
FIG. 2 is a cross-sectional view of the prior art vacuum chuck taken along line 2—2 of FIG. 1, wherein the chuck is shown supporting a wafer.

Chuck 102 includes a base 108 having an upper surface 110 and a plurality of spacers 112 for holding insert 104 in spaced relationship to upper surface 110. Base 108 and spacers 112 are preferably made of metal, such as aluminum but may be made of other materials, e.g., ceramic or plastic. In a preferred embodiment, chuck 102 may be a conventional pin-type chuck, such as chuck 10 shown in FIGS. 1 and 2, or similar chuck. By using a conventional chuck, the expense of obtaining a new chuck may be avoided when retrofitting an existing chuck with insert 104 of the present invention.

Spacers 112 are preferably pin-shaped structures extending about 2 millimeters above upper surface 110. However, spacers 112 may be any shape desired and may be provided in any number and at any locations desired. For example, they may form pyramids or rings that are concentric with one another and chuck 102, among other shapes. The number and locations of spacers 112 should be selected so that insert 104 does not distort significantly between adjacent spacers when a vacuum is applied to the insert as described below. Spacers 112 may be formed integrally with base 108 or, alternatively, may be formed separately from the base and attached thereto by mechanical fastening, bonding or other means. Upper ends 114 of spacers 112 are adapted to engage insert 104 and preferably lie within a common plane (not shown) that, when vacuum chuck/insert 100 is in use, is typically positioned parallel to the focal plane of a projection lithography tool (not shown).

Chuck 102 further includes a first vacuum seal 116 and a second vacuum seal 118 that define a first vacuum region 120 and a second vacuum region 122. First vacuum seal 116 is preferably located inwardly adjacent outer periphery 124 of insert 104 and is preferably the same shape as outer periphery 124. In a preferred embodiment, first vacuum seal 116 is a continuous annular ring. However, first vacuum seal 116 may be located at any location and be any shape suitable for a particular application. Second vacuum seal 118 is located radially inward from first vacuum seal 116 and is preferably the same shape as the first vacuum seal. That is, if first vacuum seal is annular in shape, second vacuum seal should also be annular in shape. First and second vacuum seals 116, 118 are preferably made of the same material as base 108 and may be formed integrally therewith or formed separately and attached thereto by mechanical fastening, bonding or other means. In addition, first and second vacuum seals 116, 118 may contact insert 104 to completely seal first and second vacuum regions 120, 122 from one another and the ambient environment or may provide a gap 126 that allows some flow therethrough. Regardless of whether or not gap 126 is provided, first and second vacuum seals 116, 118 should not interfere with insert 104 being drawn against upper ends 114 of spacers 112.

First vacuum region 120 is generally annular in shape and is defined by first and second vacuum seals 116, 118, insert 104 and upper surface 110 of base 108. Second vacuum region 122 is generally circular in shape and is defined by second vacuum seal 118, insert 104 and upper surface 110 of base 108. First vacuum region 120 is in fluid communication with a vacuum system (not shown) via vacuum ports 128, and second vacuum region 122 is in fluid communication with the same or separate vacuum system via vacuum ports 130.

Two vacuum regions, such as first and second vacuum regions 120, 122, are preferred so that one may be used independently of the other. The reason for this will become apparent from the description of the function of vacuum chuck/insert assembly 100 appearing below. However, in other embodiments, more or fewer vacuum seals and, therefore, more or fewer vacuum chambers may be provided to suit a particular design. For example, in an embodiment wherein spacers 112 are concentric annular rings, the annular rings may also function as vacuum seals and, therefore, may define a plurality of vacuum chambers, each located between an adjacent pair of the ringshaped spacers. One skilled in the art will recognize the variety of vacuum seal arrangements that may be used with vacuum chuck/insert assembly 100 of the present invention.

Insert 104 includes a base 132 having an upper surface 134 and a plurality of spacers 136 for holding wafer 106 in spaced relationship to upper surface 134. Outer periphery 124 is preferably circular to correspond to the circular shape of wafer 106. Base 132 and spacers 136 are preferably made of silicon, and are preferably integral with one another. However, base 132 and spacers 136 may be made of another material, such as silicon carbide, quartz, gallium arsenide, metal, plastic or ceramic, among others and may be formed separately from one another. In a presently-preferred embodiment, insert 104 is formed from a conventional silicon wafer. When insert 104 is made of silicon or other semiconductor material, it may advantageously be cleaned using any of many relatively gentle wafer cleaning procedures known in the art that do not cause the excessive wear typically caused by cleaning techniques used to clean conventional vacuum chucks.

Figure 4:
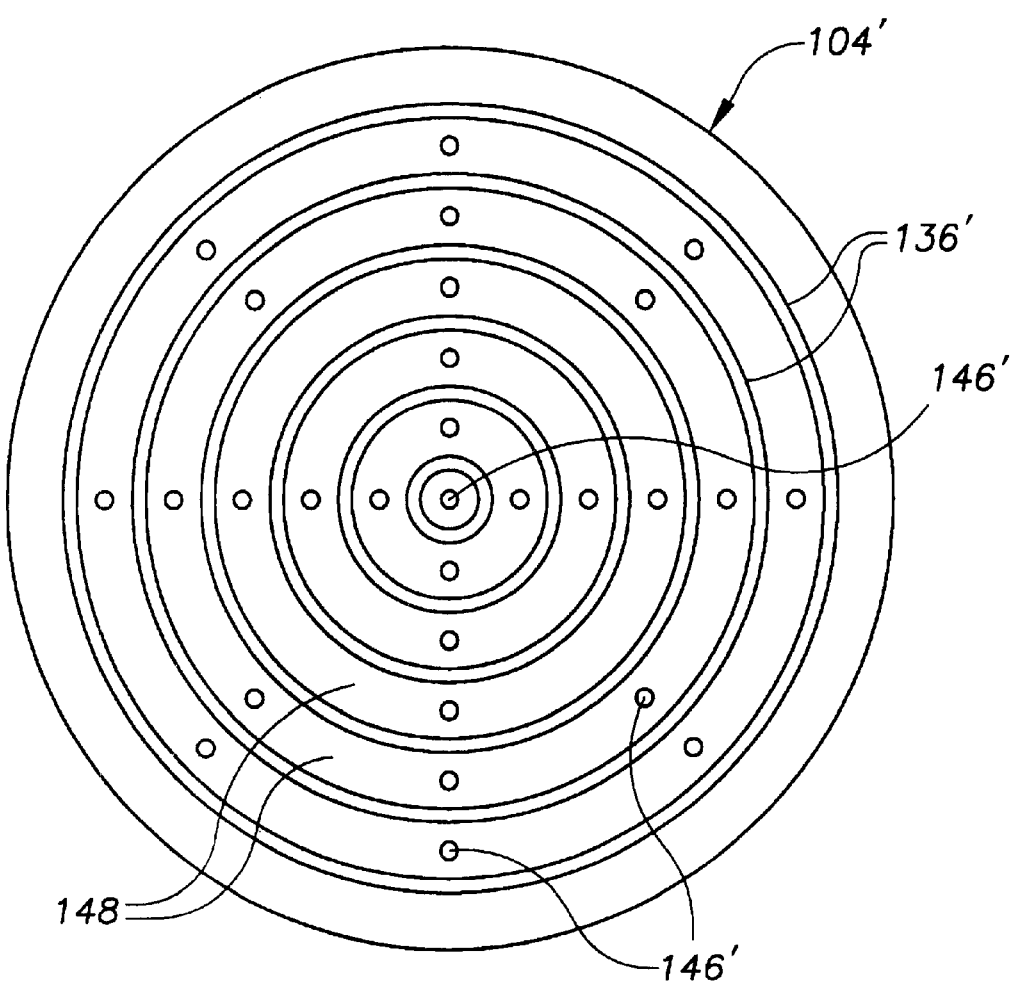
FIG. 4 is a plan view of a vacuum chuck/insert assembly according to the present invention wherein the insert includes spacers that form concentric annular rings.

Spacers 136 are preferably located at locations generally corresponding to spacers 112 of chuck 102, but may be located upon upper surface 134 anywhere desired. Regardless of their locations, spacers 136 should be spaced close enough; together so that wafer does not distort significantly between adjacent spacers when a vacuum is applied to the wafer as described below. In addition, the general shape of spacers 136 preferably corresponds to the shape of spacers 112 of chuck 102. For example, if spacers 112 are pin-sbaped, spacers 136 are preferably also pin-shaped Similarly, if spacers 112 are concentric annular rings, spacers 136 are preferably also concentric annular rings. FIG. 4 shows an insert 104' having spacers 136' that form concentric annular rings. However, spacers 136 may be any shape desired to suit a particular application.

Although the general shape of spacers 136 is preferably the same as the shape of spacers 112, the thickness or diameter, depending upon the particular shape, of spacers 136 will typically be smaller than the corresponding dimension of spacers 112. This is so because it is desirable to minimize the contact area between spacers 136 and wafer 106 to reduce the probability that dirt particles (not shown) will interfere with direct contact between spacers 136 and the wafer. In a preferred embodiment wherein spacers 136 are pin-shaped (FIG. 3), the diameter of spacers 136 is preferably between about 5 micrometers and about 50 micrometers and more preferably about 10 micrometers. However, the diameter of spacers 136 may be any desired. In addition, the height-to-diameter ratio of spacers 136 is preferably but not necessarily, about 3:1. When spacers 136 are annular rings, such as spacers 136' of FIG. 4, the rings should preferably have a thickness of about 5 micrometers to about 50 micrometers and should preferably have a height-to-thickness ratio of about 3:1. However, the thickness and height-to-tickness ratio may be any desired.

Vacuum region 142 is in fluid communication with second vacuum region 122 via vacuum ports 146. In alternative embodiments, more vacuum seals, and therefore more vacuum chambers, and/or more vacuum ports may be provided to suit a particular design. For example, in the embodiment of FIG. 4 wherein spacers 136' are concentric annular rings, the spacers may also function as vacuum seals and, therefore, may define a plurality of vacuum chambers 148, each located between an adjacent pair of the ring-shaped spacers and having one or more vacuum ports 146' One skilled in the an will recognize the variety of vacuum seal and vacuum port arrangements that may be used with vacuum chuck/insert assembly 100 of the present invention.

As mentioned above, insert 104 is preferably made from a silicon wafer, which is relatively inexpensive and commonly used in semiconductor manufacturing.

Accordingly, insert 104 may be formed using wafer processing techniques known to those skilled in the art of semiconductor manufacturing. For example, insert 104 may be formed as follows. First, a silicon wafer having a generally uniform thickness of about 800 micrometers is placed onto a wafer stage (not shown) of a projection photolithography tool and a map is made of the front side of the wafer that indicates the topography of the front side of the wafer. Such mapping is a function provided by virtually every commercial lithography tool and is performed in a manner known to those skilled in the art. The front side is then planarized, e.g., using a local plasma etching tool, to remove "high spots" on the front side of the wafer to make the front side planar. For example, if the mapping indicates there are regions on the front side of the wafer that are 2 micrometers higher than the lowest point on the front side, an operator may use a plasma etching tool to remove up to 2 micrometers of material from the front side so that the entire front side is at the level of the lowest point.

After the front side of the wafer has been planarized, spacers 136 and vacuum seal 140 are patterned and formed using silicon processing techniques known in the art. For example, patterning may be accomplished using well-known lithography, photoresist and photoresist etching processes. Etching of the wafer to form spacers 136 and seal 140 may be performed, e.g., using deep-trench-type processing such as reactive ion etching. Vacuum ports 146 may be formed, e.g., by processing the wafer from the backside using a wet-etch technique. Wet etching may be used since vacuum ports 146 are relatively large.

When vacuum chuck/insert assembly 100 is used as a wafer chuck for a projection photolithography tool, it preferably functions as follows. First, vacuum ports 128, 130 are attached to one or more vacuum sources (not shown). Insert 104 is placed upon spacers 112 of chuck 102 so that the insert covers entire first vacuum seal 116 and spacers 136 project upward. A vacuum is then induced in first vacuum region 120 via vacuum ports 128 to draw insert 104 into contact with upper ends 114 of spacers 12 within the first vacuum region.

Wafer 106 is then placed upon spacers 136 of insert 104 so that the wafer covers entire vacuum seal 140. A vacuum is then induced in second vacuum region 122 via vacuum ports 18 so that insert 104 is drawn into contact with upper ends 114 of spacers 112 within the second vacuum region. Since vacuum region 142 is in fluid communication with second vacuum region 122 via vacuum ports 146, the vacuum induced in the second vacuum region also induces a vacuum in vacuum region 142 that draws wafer 106 into contact with upper ends 138 of spacers 136. While a vacuum is maintained within vacuum regions 120, 122, 142, any bowing or other out-of-planeness of insert 104 and wafer 106 is removed and the wafer may be patterned with the photolithography tool.

While the present invention has been described in connection with a preferred embodiment, it will be understood that it is not so limited. On the contrary, it is intended to cover all alternatives, modifications and equivalents as may be included within the spirit and scope of the invention as defined in the appended claims.

What is claimed is:

1. An assembly for holding a workpiece, comprising:
 a chuck that includes:
  a first base having a first surface; and
  at least one first spacer extending away from said first surface; and
 an insert removably engaged with said at least one first spacer so as to form a first vacuum
  region between said insert and said chuck, said insert including:
   a second base having a second surface; and at least one second spacer extending away from said second surface and having a distal end located opposite said second surface, said distal end adapted for engaging the workpiece.

2. An assembly according to claim 1, wherein said insert comprises a plurality of second spacers.

3. An assembly according to claim 2, wherein said plurality of spacers comprises pin-shaped structures.

4. An assembly according to claim 2, wherein said plurality of second spacers comprise rings that are concentric with one another.

5. An assembly according to claim 1, wherein said insert is made from a crystalline wafer.

6. An assembly according to claim 5, wherein said insert comprises a plurality of second spacers integral with said second base.

7. An assembly according to claim 6, wherein said plurality of second spacers comprise pin-shaped structures.

8. An assembly according to claim 6, wherein said plurality of second spacers comprise rings that are concentric with one another.

9. An assembly according to claim 7, wherein the diameter of each pin-shaped structure is no greater than about 50 micrometers.

10. An vacuum chuck insert for supporting a first microelectronic wafer, comprising:
   a. a base formed from a second microelectronic wafer and having a surface; and
   b. a plurality of projections formed from said second microelectronic wafer for supporting the first microelectronic wafer, said plurality of projections extending away from said surface, each of said plurality of projections having at least one surface that is substantially perpendicular to said surface.

11. An insert according to claim 10, wherein each of said plurality of projections comprises a pin-shaped structure.

12. An insert according to claim 11, wherein the diameter of each pin-shaped structure is no greater than about 50 micrometers.

13. An insert according to claim 11, wherein the ratio of height to diameter is greater than about 2:1.

14. An insert according to claim 10, wherein said plurality of projections are annular rings.

* * * * *